(12) United States Patent
Hara et al.

(10) Patent No.: US 10,091,903 B2
(45) Date of Patent: Oct. 2, 2018

(54) POWER CONVERSION DEVICE HAVING BUS BAR WITH IMPROVED VIBRATION RESISTANCE

(71) Applicant: Hitachi Automotive Systems, Ltd., Hitachinaka-shi, Ibaraki (JP)

(72) Inventors: Yosei Hara, Hitachinaka (JP); Morio Kuwano, Hitachinaka (JP); Akira Ishii, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/538,036

(22) PCT Filed: Jan. 29, 2016

(86) PCT No.: PCT/JP2016/052556
§ 371 (c)(1),
(2) Date: Jun. 20, 2017

(87) PCT Pub. No.: WO2016/132851
PCT Pub. Date: Aug. 25, 2016

(65) Prior Publication Data
US 2017/0353118 A1  Dec. 7, 2017

(30) Foreign Application Priority Data

Feb. 19, 2015 (JP) .................. 2015-030147

(51) Int. Cl.
*H05K 7/14* (2006.01)
*H01L 23/40* (2006.01)
(52) U.S. Cl.
CPC ........... *H05K 7/1432* (2013.01); *H01L 23/40* (2013.01)

(58) Field of Classification Search
CPC ................. H05K 7/1432; H01L 23/34–23/473
See application file for complete search history.

(56) References Cited

U.S. PATENT DOCUMENTS

2002/0195286 A1* 12/2002 Shirakawa .......... B60L 11/1803
                                                180/65.1
2010/0025126 A1   2/2010 Nakatsu et al.
2014/0048868 A1*  2/2014 Kim .................... H01L 29/7926
                                                257/324

FOREIGN PATENT DOCUMENTS

JP         2006-194650 A      7/2006
JP         2005004648    *    7/2006    ............. G01R 15/20

(Continued)

OTHER PUBLICATIONS

International Search Report (PCT/ISA/210) issued in PCT Application No. PCT/JP2016/052556 dated May 17, 2016 with English translation (Three (3) pages).

(Continued)

*Primary Examiner* — Gary L Laxton
*Assistant Examiner* — Peter Novak
(74) *Attorney, Agent, or Firm* — Crowell & Moring LLP

(57) ABSTRACT

To suppress reduction in resistance against vibrations, while reducing the number of components, a power conversion device including a power semiconductor module that converts a DC current into an AC current, a plate conductor that transfers the DC current or the AC current, a resin sealing material that seals the plate conductor, and an electric component that is used to control the power semiconductor module has the resin sealing material include a supporting member. The supporting member supports the electric component, and the plate conductor is buried in a portion of the resin sealing material that is disposed to face the electric component.

7 Claims, 10 Drawing Sheets

(56) References Cited

FOREIGN PATENT DOCUMENTS

| JP | 2010-35347 A | 2/2010 |
|----|----|----|
| WO | WO 2013/065849 A1 | 5/2013 |
| WO | WO 2014/136354 A1 | 9/2014 |

OTHER PUBLICATIONS

Japanese-language Written Opinion (PCT/ISA/237) issued in PCT Application No. PCT/JP2016/052556 dated May 17, 2016 (Five (5) pages).

\* cited by examiner

A-A CROSS-SECTION

B-B CROSS-SECTION

D-D CROSS-SECTION

POWER CONVERSION DEVICE HAVING BUS BAR WITH IMPROVED VIBRATION RESISTANCE

TECHNICAL FIELD

The present invention relates to a power conversion device, and particularly to a power conversion device which is used in a vehicle.

BACKGROUND ART

There is a request for minimizing electric components mounted in a hybrid vehicle and an electric vehicle in order to minimize these vehicles and to secure spaces therein. In particular, a power conversion device which controls a driving motor for the hybrid vehicle and the electric vehicle is requested to be minimized. On the other hand, resistance against vibrations caused from variations in a road status while running and from the engine or the motor is also requested for the power conversion device used in the hybrid vehicle and the electric vehicle.

PTL 1 (JP 2010-35347 A) discloses a technique of supporting a driver board and a control board using a metal base.

However, there is a request for a technique of suppressing a reduction of resistance against vibration while reducing the number of components for the miniaturization.

CITATION LIST

Patent Literature

PTL 1: JP 2010-35347 A

SUMMARY OF INVENTION

Technical Problem

An object of the invention is to suppress a reduction of resistance against vibration while reducing the number of components.

Solution to Problem

In order to solve the problem, a power conversion device according to the present invention includes: a power semiconductor module that converts a DC current into an AC current; a plate conductor that transfers the DC current or the AC current; a resin sealing material that seals the plate conductor; and an electric component that is used to control the power semiconductor module, wherein the resin sealing material includes a supporting member that supports the electric component, and wherein the plate conductor is buried in a portion of the resin sealing material that is disposed to face the electric component.

Advantageous Effects of Invention

According to the invention, it is possible to suppress a reduction of resistance against vibrations while reducing the number of components.

DESCRIPTION OF EMBODIMENTS

Figure 1:
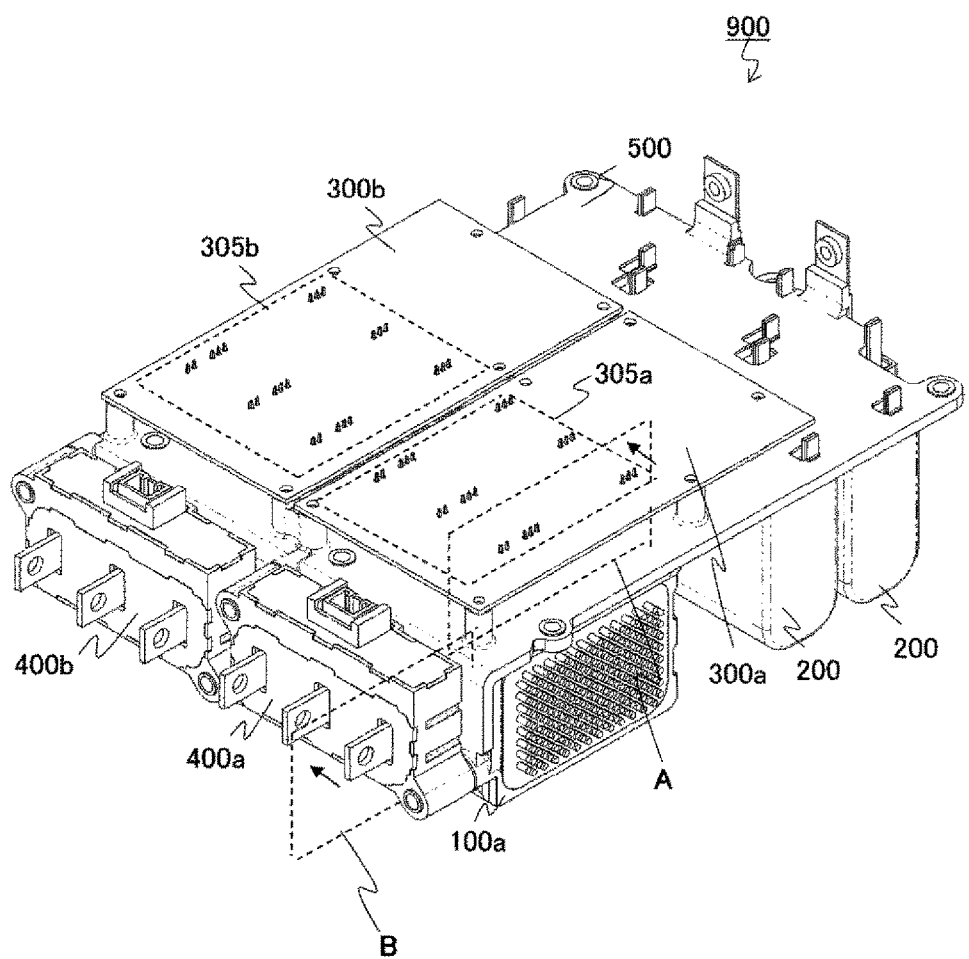
FIG. 1 is a perspective view illustrating the entire configuration of a main circuit unit 900 of a power conversion device.

Hereinafter, embodiments of the invention will be descried using the drawings. The following descriptions will be given about a specific example of the content of the invention. However, the invention is not limited to these descriptions, and various changes and modifications may be made by a person skilled in the art within a scope of technical ideas disclosed in this specification. In addition, the components having the same function will be denoted by the same symbols in the drawings for the description of the invention, and the redundant description will be omitted.

Figure 2:
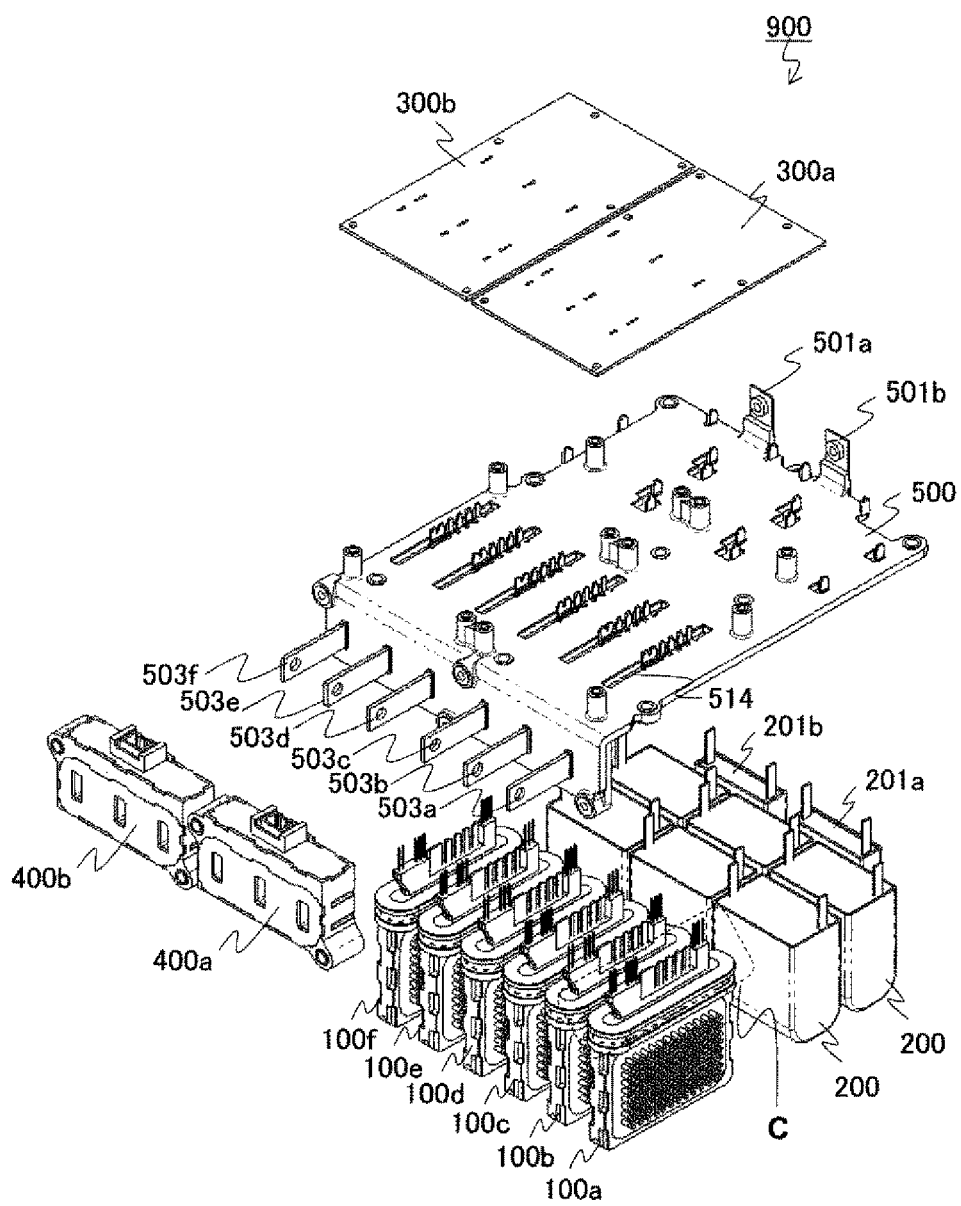
FIG. 2 is an exploded perspective view of the main circuit unit 900 of the power conversion device.
Figure 3:
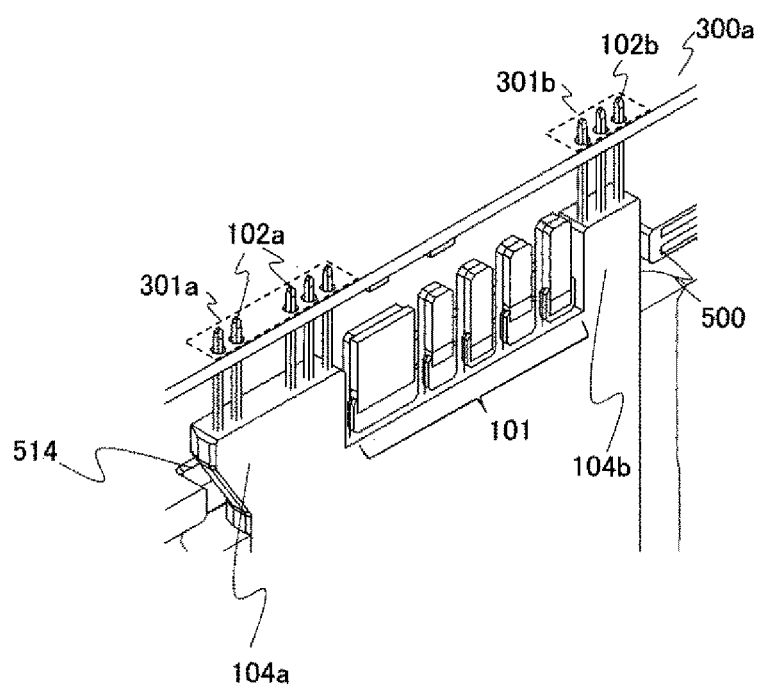
FIG. 3 is a cross-sectional perspective view illustrating the vicinity of a connecting portion of a signal terminal when viewed in a direction of arrow in plane A illustrated in FIG. 1.
Figure 4:
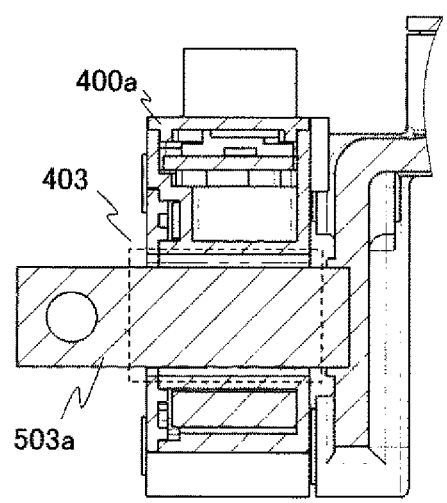
FIG. 4 is a cross-sectional view of a layout of a current sensor when viewed from a direction of arrow in plane B illustrated in FIG. 1.
Figure 5:
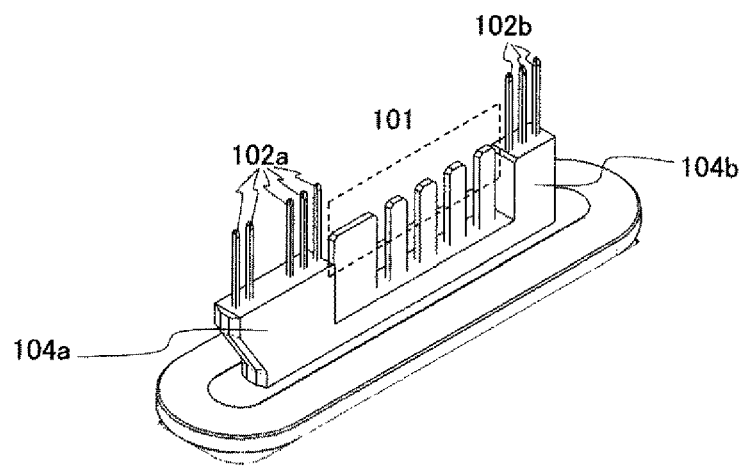
FIG. 5 is a partially enlarged view of a power terminal 101 and signal terminals 102a and 102b of a power semiconductor module 100a of range C of FIG. 2.

FIG. 1 is a perspective view illustrating the entire configuration of a main circuit unit 900 of a power conversion device. Herein, the main circuit unit 900 is a circuit unit which receives DC power from a battery mounted in a vehicle and outputs AC power to a motor for driving the vehicle. FIG. 2 is an exploded perspective view of the main circuit unit 900 of the power conversion device. FIG. 3 is a cross-sectional perspective view of the vicinity of a connecting portion between signal terminals 102a and 102b and a driver circuit board 300a when viewed from a direction of arrow of plane A illustrated in FIG. 1. FIG. 4 is a cross-sectional view of the vicinity of a current sensor 400 when viewed from a direction of arrow of plane B illustrated in FIG. 1. FIG. 5 is a partially enlarged view of a power terminal 101 and the signal terminals 102a and 102b of a power semiconductor module 100a in range C of FIG. 2.

The power semiconductor modules 100a to 100f illustrated in FIG. 2 include inverter circuits which convert DC power into AC power. In this embodiment, one power semiconductor module 100a forms an upper and lower arm circuit to output one phase current among the inverter circuits which output three-phase AC currents. For example, the power semiconductor module 100a is a U-phase upper and lower arm circuit, a power semiconductor module 100b is a V-phase upper and lower arm circuit, and a power semiconductor module 100c is a W-phase upper and lower arm circuit. Then, the power semiconductor modules 100a to 100c form a first inverter circuit. Similarly, a power semiconductor module 100d is a U-phase upper and lower arm circuit, a power semiconductor module 100e is a V-phase upper and lower arm circuit, and a power semiconductor module 100f is a W-phase upper and lower arm circuit. Then, the power semiconductor modules 100d to 100f form a second inverter circuit. In other words, in this embodiment, one power conversion device 1 is provided with two inverter circuits. These two inverter circuits each may drive separate motors, or may drive one motor.

A capacitor module 200 illustrated in FIGS. 1 and 2 smooths the DC power which is supplied to the first inverter circuit and the second inverter circuit. Noise filtering capacitors 201a and 201b remove noises which are transferred from the battery.

The driver circuit board 300a illustrated in FIGS. 1 and 2 are disposed at a position to face the power semiconductor modules 101a to 100c. Similarly, a driver circuit board 300b is disposed at a position to face the power semiconductor modules 101d to 100f. In addition, the driver circuit board 300a and the driver circuit board 300b are formed such that parts thereof face to the capacitor module 200.

A mold bus bar 500 illustrated in FIGS. 1 and 2 transfers the DC power and the AC power to the first inverter circuit and the second inverter circuit which will be described below using FIG. 6 and the subsequent drawings. The mold bus bar 500 is disposed between a region where the driver circuit board 300a and the driver circuit board 300b are disposed, and a region where the power semiconductor modules 100a to 100f and the capacitor module 200 are disposed. In addition, the mold bus bar 500 electrically connects the power semiconductor modules 100a to 100f and the capacitor module 200, and supports the driver circuit board 300a and the driver circuit board 300b, and a current sensor 400a and a current sensor 400b.

In addition, as illustrated in FIGS. 2 and 3, the mold bus bar 500 is formed with a first through hole 514 through which the power terminal 101, the signal terminal 102a, and the signal terminal 102b are passed. In a connecting portion 301a, the signal terminal 102a is connected to the driver circuit board 300a. Similarly, in a connecting portion 301b, the signal terminal 102b is connected to the driver circuit board 300a. In this embodiment, the power terminal 101 is disposed between the signal terminal 102a and the signal terminal 102b. Then, part of the signal terminal 102a is covered by a terminal protecting portion 104a, and part of the signal terminal 102b is covered by a terminal protecting portion 104b. The terminal protecting portion 104a and the terminal protecting portion 104b are formed from a place where the power semiconductor module 100a is disposed up to a place where the driver circuit board 300a is disposed through the first through hole 514. With this configuration, the mold bus bar 500, the signal terminal 102a, and the signal terminal 102b can come into contact with each other at the time of assembling with high reliability.

In addition, since the thickness of the terminal protecting portion 104a and the terminal protecting portion 104b is made thicker than that of the power terminal 101, the contact between the mold bus bar 500 and the power terminal 101 is suppressed at the time of assembling, and thus the reliability can be improved. The terminal protecting portion 104a and the terminal protecting portion 104b is configured by an insulating resin material. Further, the signal terminal 102a and the signal terminal 102b are disposed with the power terminal 101 interposed therebetween, and the power terminal 101 may be protected by the terminal protecting portion 104a and the terminal protecting portion 104b.

Figure 8:
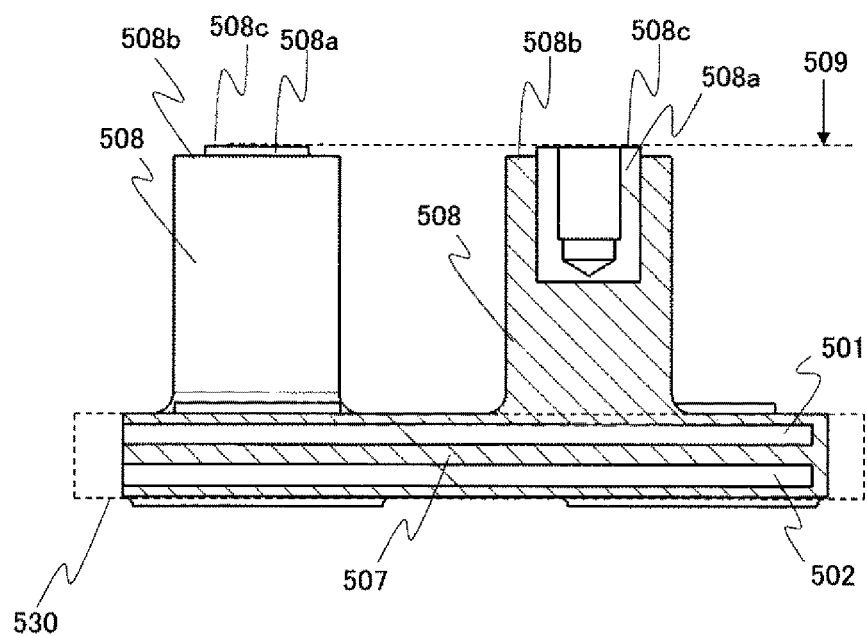
FIG. 8 is a cross-sectional view partially illustrating the mold bus bar 500 when viewed from a direction of arrow of plane A of FIG. 6.
Figure 9:
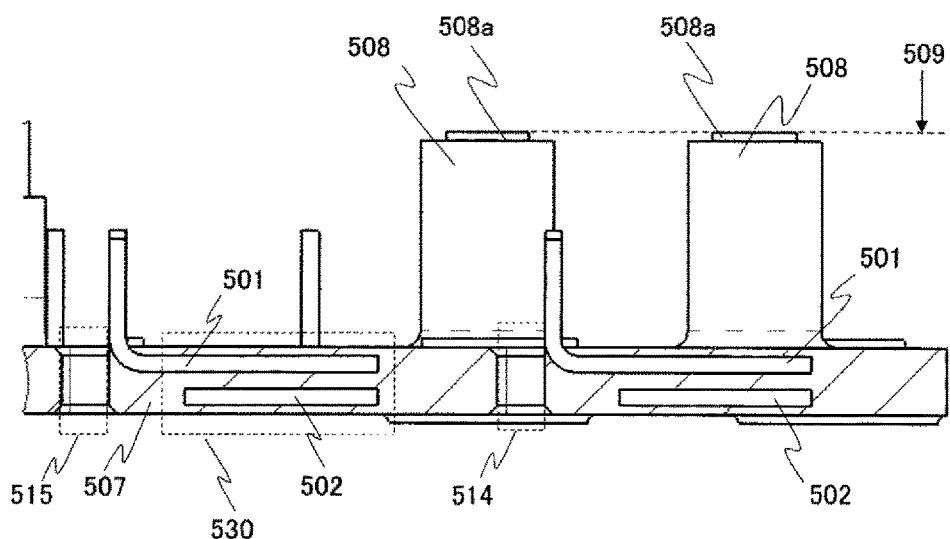
FIG. 9 is a cross-sectional view partially illustrating the mold bus bar 500 when viewed from a direction of arrow of plane B of FIG. 6.
Figure 10:
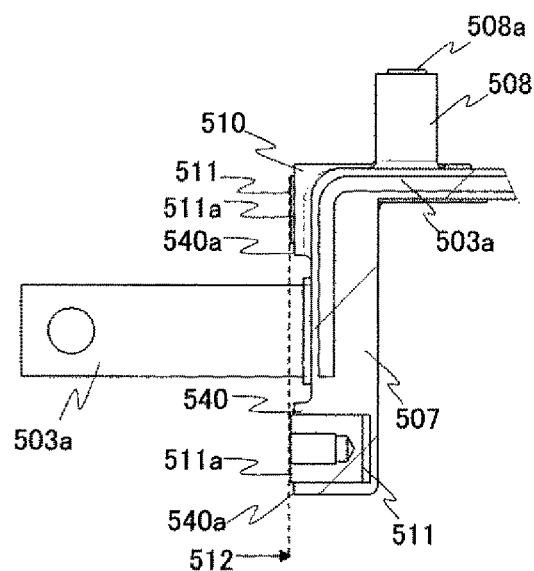
FIG. 10 is a cross-sectional view partially illustrating the mold bus bar 500 when viewed from a direction of arrow of plane D of FIG. 6.

The current sensor 400a illustrated in FIGS. 2 and 4 detects an AC current flowing to AC bus bars 503a to 503c, and the current sensor 400b detects an AC current flowing to AC bus bars 503d to 503f. The current sensor 400a and the current sensor 400b form through holes 403 through which the AC bus bars 503a to 503f pass. FIG. 6 is a perspective view illustrating the entire configuration of the mold bus bar 500. FIG. 7 is an exploded perspective view of the mold bus bar 500. FIG. 8 is a cross-sectional view partially illustrating the mold bus bar 500 when viewed from a direction of arrow of plane A of FIG. 6. FIG. 9 is a cross-sectional view partially illustrating the mold bus bar 500 when viewed from a direction of arrow of plane B of FIG. 6. FIG. 10 is a cross-sectional view partially illustrating the mold bus bar 500 when viewed from a direction of arrow of plane D of FIG. 6.

As illustrated in FIG. 7, the mold bus bar 500 is configured by a negative conductor plate 501, a positive conductor plate 502, the AC bus bars 503a to 503f, and a resin sealing material 507. The negative conductor plate 501, the positive conductor plate 502, and the AC bus bars 503a to 503f each are a plate conductor which is configured by side surfaces and main surfaces having an area larger than that of the side surface. The negative conductor plate 501, the positive conductor plate 502, and the AC bus bars 503a to 503f are formed such that the main surface of the negative conductor plate 501, the main surface of the positive conductor plate 502, and part of the main surface of the AC bus bars 503a to 503f face to the same direction.

Figure 6:
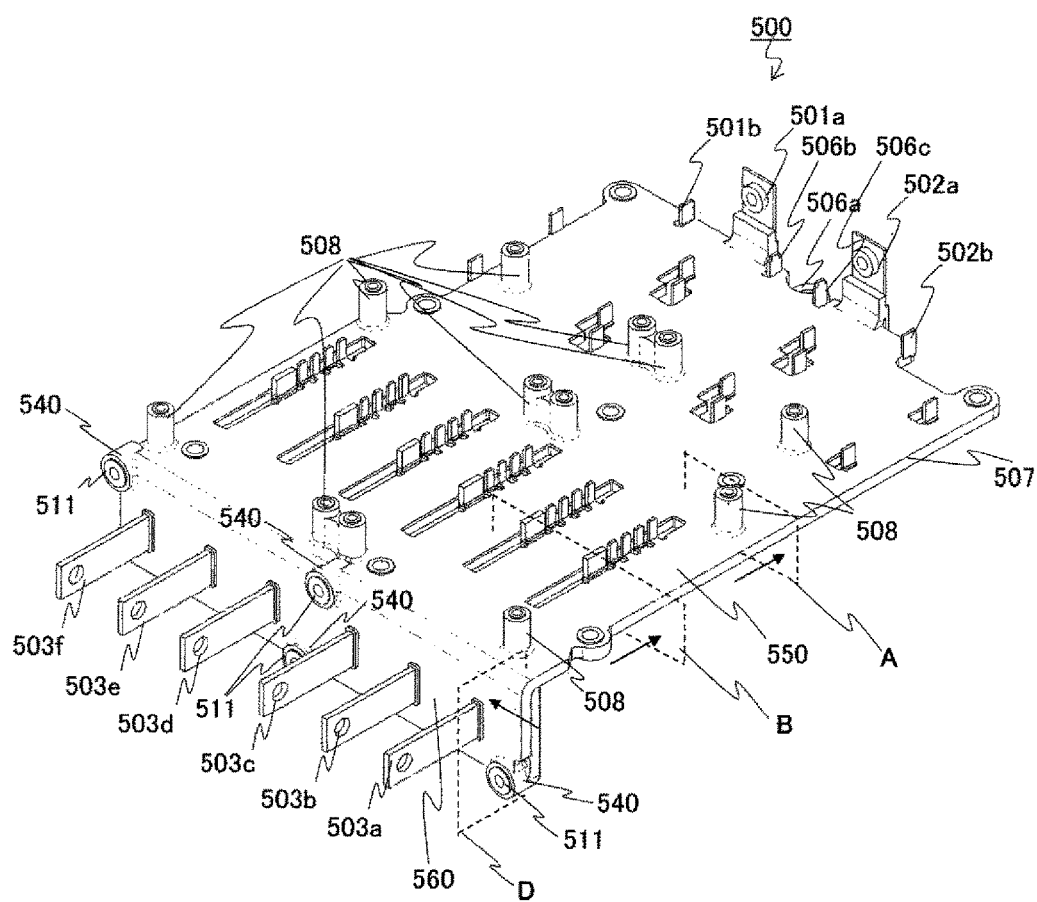
FIG. 6 is a perspective view illustrating the entire configuration of a mold bus bar 500.
Figure 7:
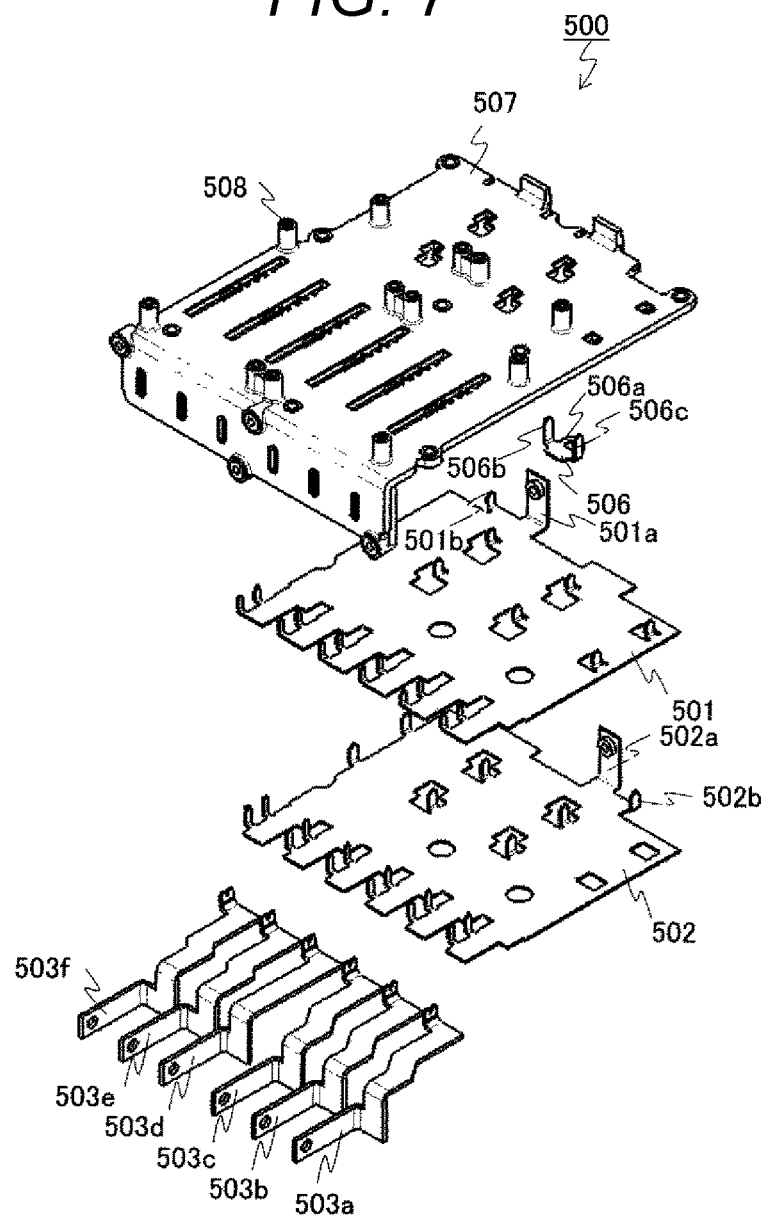
FIG. 7 is an exploded perspective view of the mold bus bar 500.

As illustrated in FIGS. 6 and 7, the resin sealing material 507 seals the negative conductor plate 501, the positive conductor plate 502, and the AC bus bars 503a to 503f such that the main surface of the negative conductor plate 501, the main surface of the positive conductor plate 502, and part of the main surface of the AC bus bars 503a to 503f are covered. In this embodiment, the AC bus bars 503a to 503f are sealed and integrated by the resin sealing material 507 together with the negative conductor plate 501 and the positive conductor plate 502 so as to form power wirings into one component (assembly). Therefore, an assembly performance can be improved. The negative conductor plate 501 in this embodiment is configured such that the main surface of the negative conductor plate 501 is disposed to face the main surface of the positive conductor plate 502, and a stacked structure is formed with respect to the positive conductor plate 502. The resin sealing material 507 is provided between the negative conductor plate 501 and the positive conductor plate 502, and the negative conductor plate 501 is electrically insulated from the positive conductor plate 502.

In addition, a negative power source terminal 501a is connected to the negative conductor plate 501 as illustrated in FIGS. 6 and 7, bent to form an angle with respect to the main surface of the negative conductor plate 501, and protrudes from the main surface of the resin sealing material 507. A positive power source terminal 502a is connected to the positive conductor plate 502, bent to form an angle with respect to the main surface of the positive conductor plate 502, and protrudes from the main surface of the resin sealing material 507. The negative power source terminal 501a and the positive power source terminal 502a are disposed on one side of the resin sealing material 507. In addition, a terminal 501b linked to the negative conductor plate 501 as illustrated in FIGS. 6 and 7 is connected to the noise filtering capacitor 201b. A terminal 502b linked to the positive conductor plate 502 is connected to the noise filtering capacitor 201a.

A ground bus bar 506 illustrated in FIGS. 6 and 7 connects the noise filtering capacitors 201a and 201b illustrated in FIG. 2 and a ground potential node (not illustrated). A ground terminal 506a protrudes from the side surface of the resin sealing material 507, and connected to the ground potential node. A terminal 506b is bent to form an angle with respect to the ground terminal 506a, protrudes from the main surface of the resin sealing material 507, and is connected to the noise filtering capacitor 201b. A terminal 506c is bent to form an angle with respect to the ground terminal 506a, and disposed to face the terminal 506b. In addition, the terminal 506c protrudes from the main surface of the resin sealing material 507, and connected to the noise filtering capacitor 201a.

The ground bus bar 506 is disposed such that a distance of the electrical path between the ground bus bar 506 and the negative power source terminal 501a is substantially equal to the distance of the electrical path between the ground bus bar 506 and the positive power source terminal 502a. For example, the ground bus bar 506 is disposed between the negative power source terminal 501a and the positive power source terminal 502a. Therefore, the distances of the electrical paths of the ground bus bar 506, the negative power source terminal 501a, and the positive power source terminal 502a can be made short and substantially equal, so that it is possible to improve a noise suppression effect.

In addition, the ground bus bar 506 is disposed such that the negative power source terminal 501a is interposed by the terminal 506b on a side near the ground bus bar 506 and the terminal 501b on a side near the negative conductor plate 501, and the positive power source terminal 502a is interposed by the terminal 506c on a side near the ground bus bar 506 and the terminal 502b on a side near the positive conductor plate 502. Therefore, the distances of the electrical paths from the noise filtering capacitor 201a to the negative power source terminal 501a and the positive power source terminal 502a can be made short and substantially equal, so that the noise suppression effect can be improved.

Further, since the ground bus bar 506 configured in a plate shape is sealed by the resin sealing material 507, the distances of the electrical paths from the ground bus bar 506 to the negative power source terminal 501a and the positive power source terminal 502a can be accurately set, so that the noise suppression effect can be improved.

A supporting member 508 illustrated in FIGS. 6 and 7 protrudes from the main surface of the resin sealing material 507, and supports the driver circuit boards 300a and 300b as illustrated in FIG. 1. The supporting member 508 in this embodiment is made of the same resin material as that of the resin sealing material 507, and integrally formed with the resin sealing material 507. Further, the supporting member 508 may be made of a resin material different from that of the resin sealing material 507, and connected to the resin sealing material 507 by a fixing member.

As illustrated in FIG. 8, each of a plurality of supporting bosses 508a is buried in each of the plurality of supporting members 508. As illustrated in FIG. 1, the driver boards 300a and 300b are supported and fixed by the plurality of supporting bosses 508a. The supporting boss 508a is buried while protruding from an end surface 508b of the supporting member 508. With this configuration, it is possible to prevent that the supporting member 508 made of a resin and the drive board 300a are worn out and fatigued to be broken due to vibrations of the vehicle. Further, end surfaces 508c of the plurality of supporting bosses 508a become flush with each other, and form a board mounting surface 509.

In addition, as illustrated in FIGS. 1 and 8, the negative conductor plate 501 or the positive conductor plate 502 are disposed such that the main surface of the negative conductor plate 501 or the main surface of the positive conductor plate 502 faces the main surfaces of the driver boards 300a and 300b, and is buried in the resin sealing material 507. Therefore, even in a case where a resin material is used as a sealing material of the mold bus bar 500 and a resin material is used as a material of the supporting member 508, the negative conductor plate 501 or the positive conductor plate 502 can improve the strength of the mold bus bar 500, and improve resistance against vibrations.

Further, the supporting member 508 is disposed in a space between the main surface of the negative conductor plate 501 or the main surface of the positive conductor plate 502 and the main surfaces of the driver boards 300a and 300b, so that the resistance against vibrations can be improved still more.

In addition, the positive conductor plate 502 includes a stacking portion 530 with respect to the negative conductor plate 501 in a portion where the respective circuit components of the driver circuit boards 300a and 300b face circuit mounting surfaces 305a and 305b. Even in a case where a resin material is used as the sealing material of the mold bus bar 500 and a resin material is used as a material of the supporting member 508, the strength of the mold bus bar 500 can be improved by the stacking portion 530, and the resistance against vibrations can be improved.

As illustrated in FIGS. 9 and 2, the mold bus bar 500 is formed by the first through hole 514 through which the power terminal 101 of the power semiconductor module 100a passes, and a second through hole 515 through which the power terminal 101 of the power semiconductor module 100b passes. Then, the stacking portion 530 of the positive conductor plate 502 and the negative conductor plate 501 extends up to a region between the first through hole 514 and the second through hole 515.

In addition, the stacking portion 530 of the portion is sealed by the resin sealing material 507. In a case where the power semiconductor module 100a and the power semiconductor module 100b are miniaturized and shortened in distance therebetween so as to achieve a miniaturization of the power conversion device, the distance between the first through hole 514 and the second through hole 506 is shortened and the strength of the mold bus bar 500 may be lowered. However, since the stacking portion 530 extends up to a region between the first through hole 514 and the second through hole 515, the strength of the mold bus bar 500 can be improved, and the resistance against vibration can be improved.

As illustrated in FIGS. 10 and 6, each of the plurality of supporting bosses 511 is buried in each of the plurality of supporting members 540. As illustrated in FIG. 1, the current sensors 400a and 400b are supported and fixed by the plurality of supporting bosses 511. The supporting boss 511 is buried while protruding from an end surface 540a of the supporting member 540. With this configuration, it is possible to prevent that the supporting member 540 made of a resin and the current sensor 400a are worn out and fatigued to be broken due to vibrations of the vehicle. Further, end surfaces 511a of the plurality of supporting bosses 511 become flush with each other, and form a sensor mounting surface 512.

In addition, as illustrated in FIGS. 10 and 7, each of the main surfaces of the AC bus bars 503a to 503f faces the current sensor 400a or the current sensor 400b, and is buried in the resin sealing material 507. Therefore, even in a case where the sealing material of the mold bus bar 500 is made of a resin material and the supporting member 540 is made of a resin material, the AC bus bars 503a to 503f can improve the strength of the mold bus bar 500, and improve the resistance against vibration.

Further, the supporting member 540 is disposed in a space between the main surface of any one of the AC bus bars 503*a* to 503*f* and the current sensor 400*a* or the current sensor 400*b*, so that the resistance against vibrations can be improved still more.

Further, in this embodiment, the electric components supported by the supporting member of the mold bus bar 500 has been described as the driver boards 300*a* and 300*b* and the current sensors 400*a* and 400*b*, and may be a control board to transfer a control signal to the driver boards 300*a* and 300*b*, the noise filtering capacitors 201*a* 201*b*, or a discharge resistor to discharge electric charges remaining in the capacitor module 200.

In addition, as illustrated in FIGS. 10 and 6, the mold bus bar 500 is provided with a first surface 550 which includes a supporting member 508 to support the driver boards 300*a* and 300*b* and a second surface 560 which includes the supporting member 540 to support the current sensors 400*a* and 400*b*. The second surface 560 and the first surface 550 are disposed to form an angle. Specifically, the second surface 560 is disposed to form an angle of 90 degrees with respect to the first surface 550. Then, in a bent portion 510 connecting the second surface 560 and the first surface 550, the AC bus bars 503*a* to 503*f* is buried in the resin sealing material 507.

Therefore, the bent portion can improve the strength of the mold bus bar 500, and the resistance against vibrations can be improved. In addition, the mold bus bar 500 is formed along the shape of a flow path forming body (not illustrated) for cooling the power semiconductor modules 100*a* to 100*f*, so that a cooling performance of the mold bus bar 500 can be improved.

REFERENCE SIGNS LIST

100*a* to 100*f* . . . power semiconductor module, 101 . . . power terminal, 102*a* . . . signal terminal, 102*b* . . . signal terminal, 104*a* . . . terminal protecting portion, 104*b* . . . terminal protecting portion, 200 . . . capacitor module, 201*a* . . . noise filtering capacitor, 201*b* . . . noise filtering capacitor, 300*a* . . . driver circuit board, 300*b* . . . driver circuit board, 301*a* . . . connecting portion, 301*b* . . . connecting portion, 305*a* . . . circuit mounting surface, 305*b* . . . circuit mounting surface, 400*a* . . . current sensor, 400*b* . . . current sensor, 403 . . . through hole, 500 . . . mold bus bar, 501 . . . negative conductor plate, 501*a* . . . negative power source terminal, 501*a* . . . terminal, 502 . . . positive conductor plate, 502*a* . . . positive power source terminal, 502*b* . . . terminal, 503*a* to 503*f* . . . AC bus bar, 506 . . . ground bus bar, 506*a* . . . ground terminal, 506*b* . . . terminal, 506*c* . . . terminal, 507 . . . resin sealing material, 508 . . . supporting member, 508*a* . . . supporting boss, 508*b* . . . end surface, 509 . . . board mounting surface, 511 . . . supporting boss, 511*a* . . . end surface, 512 . . . sensor mounting surface, 514 . . . first through hole, 515 . . . second through hole, 522 . . . DC terminal, 530 . . . stacking portion, 540 . . . supporting member, 540*a* . . . end surface, 900 . . . main circuit unit

The invention claimed is:

1. A power conversion device, comprising:
a power semiconductor module that converts a DC current into an AC current;
a plate conductor that transfers the DC current or the AC current;
a resin sealing material that seals the plate conductor; and
an electric component that is used to control the power semiconductor module,
wherein the resin sealing material includes at least one supporting member that supports the electric component,
wherein the plate conductor is buried in a portion of the resin sealing material that is disposed to face the electric component,
wherein the at least one supporting member includes a first supporting member to support a driver circuit board and a second supporting member to support a current sensor,
wherein the resin sealing material includes a first surface equipped with the first supporting member and a second surface equipped with the second supporting member, in which the first surface and the second surface are disposed to form an angle with respect to each other,
wherein the resin sealing material includes a bent portion that connects the first surface and the second surface, and
wherein the plate conductor is at least partially disposed within the bent portion of the resin sealing material.

2. The power conversion device according to claim 1, wherein the electric component is a driver circuit board that drives the power semiconductor module,
wherein the plate conductor is configured by a positive plate conductor and a negative plate conductor to transfer the DC current, and
wherein the positive plate conductor includes a stacking portion with respect to the negative plate conductor in a portion facing a mounting surface of a circuit component of the driver circuit board.

3. The power conversion device according to claim 2, wherein the power semiconductor module is one of at least two power semiconductor modules,
wherein the resin sealing material forms a first through hole through which a power terminal of one power semiconductor module passes, and a second through hole through which a power terminal of the other power semiconductor module passes, and
wherein the stacking portion extends up to a region between the first through hole and the second through hole.

4. The power conversion device according to claim 1, wherein the electric component is a current sensor that detects the AC current,
wherein the plate conductor is configured by an AC plate conductor that transfers the AC current, and
wherein the AC plate conductor is disposed at a position to face a supporting member that supports the current sensor.

5. The power conversion device according to claim 1, wherein the electric component includes a driver circuit board that drives the power semiconductor module, and a current sensor that detects the AC current, and
wherein the plate conductor is configured by a positive plate conductor and a negative plate conductor to transfer the DC current, and an AC plate conductor to transfer the AC current.

6. The power conversion device according to claim 5, wherein the AC plate conductor is partially buried in the bent portion.

7. A power conversion device, comprising:
a power semiconductor module that converts a DC current into an AC current;
a plate conductor that transfers the DC current or the AC current;

a resin sealing material that seals the plate conductor; and
an electric component that is used to control the power semiconductor module,
wherein the resin sealing material includes a supporting member that supports the electric component,
wherein the plate conductor is buried in a portion of the resin sealing material that is disposed to face the electric component,
wherein the electric component includes a driver circuit board that drives the power semiconductor module, and a current sensor that detects the AC current,
wherein the plate conductor is configured by a positive plate conductor and a negative plate conductor to transfer the DC current, and an AC plate conductor to transfer the AC current,
wherein the supporting member includes a first supporting member to support the driver circuit board, and a second supporting member to support the current sensor,
wherein the resin sealing material includes a first surface equipped with the first supporting member and a second surface equipped with the second supporting member, in which the first surface and the second surface are disposed to form an angle with respect to each other,
wherein the resin sealing material includes a bent portion that connects the first surface and the second surface, and
wherein part of the AC plate conductor is buried in the bent portion.

* * * * *